(12) United States Patent
Suh et al.

(10) Patent No.: US 7,535,099 B2
(45) Date of Patent: May 19, 2009

(54) SINTERED METALLIC THERMAL INTERFACE MATERIALS FOR MICROELECTRONIC COOLING ASSEMBLIES

(75) Inventors: Daewoong Suh, Phoenix, AZ (US); Chi-won Hwang, Tsukuba (JP)

(73) Assignee: Intel Corporation, Santa Clara, CA (US)

( * ) Notice: Subject to any disclaimer, the term of this patent is extended or adjusted under 35 U.S.C. 154(b) by 155 days.

(21) Appl. No.: 11/528,123

(22) Filed: Sep. 26, 2006

(65) Prior Publication Data

US 2008/0073776 A1    Mar. 27, 2008

(51) Int. Cl.
*H01L 23/373* (2006.01)
(52) U.S. Cl. ............... 257/713; 257/712; 257/E23.112
(58) Field of Classification Search ............... 257/712, 257/713, E23.112
See application file for complete search history.

(56) References Cited

U.S. PATENT DOCUMENTS

| 2005/0255646 A1* | 11/2005 | Cheng et al. ............... 438/214 |
| 2006/0023665 A1* | 2/2006 | Zellner et al. ............... 370/329 |
| 2006/0113546 A1* | 6/2006 | Sung ............................. 257/77 |
| 2007/0243661 A1* | 10/2007 | Jackson et al. ............. 438/106 |
| 2008/0023665 A1* | 1/2008 | Weiser et al. ................ 252/71 |

OTHER PUBLICATIONS

U.S. Appl. No. 10/954,959, filed Sep. 29, 2004, Suh.
U.S. Appl. No. 11/116,537, filed Mar. 3, 2005, Badawi.
U.S. Appl. No. 11/229,184, filed Sep. 15, 2005, Suh.
U.S. Appl. No. 11/395,667, filed Mar. 30, 2006, Suh.

* cited by examiner

*Primary Examiner*—Victor A Mandala
(74) *Attorney, Agent, or Firm*—Kathy J. Ortiz

(57) ABSTRACT

A microelectronic cooling assembly and method for fabricating the same are described. In one example, a microelectronic cooling assembly includes a microelectronic device, a heat spreader, and a thermal interface material (TIM) that thermally joins the microelectronic device and heat spreader, the TIM comprising a sintered metallic nanopaste.

27 Claims, 4 Drawing Sheets

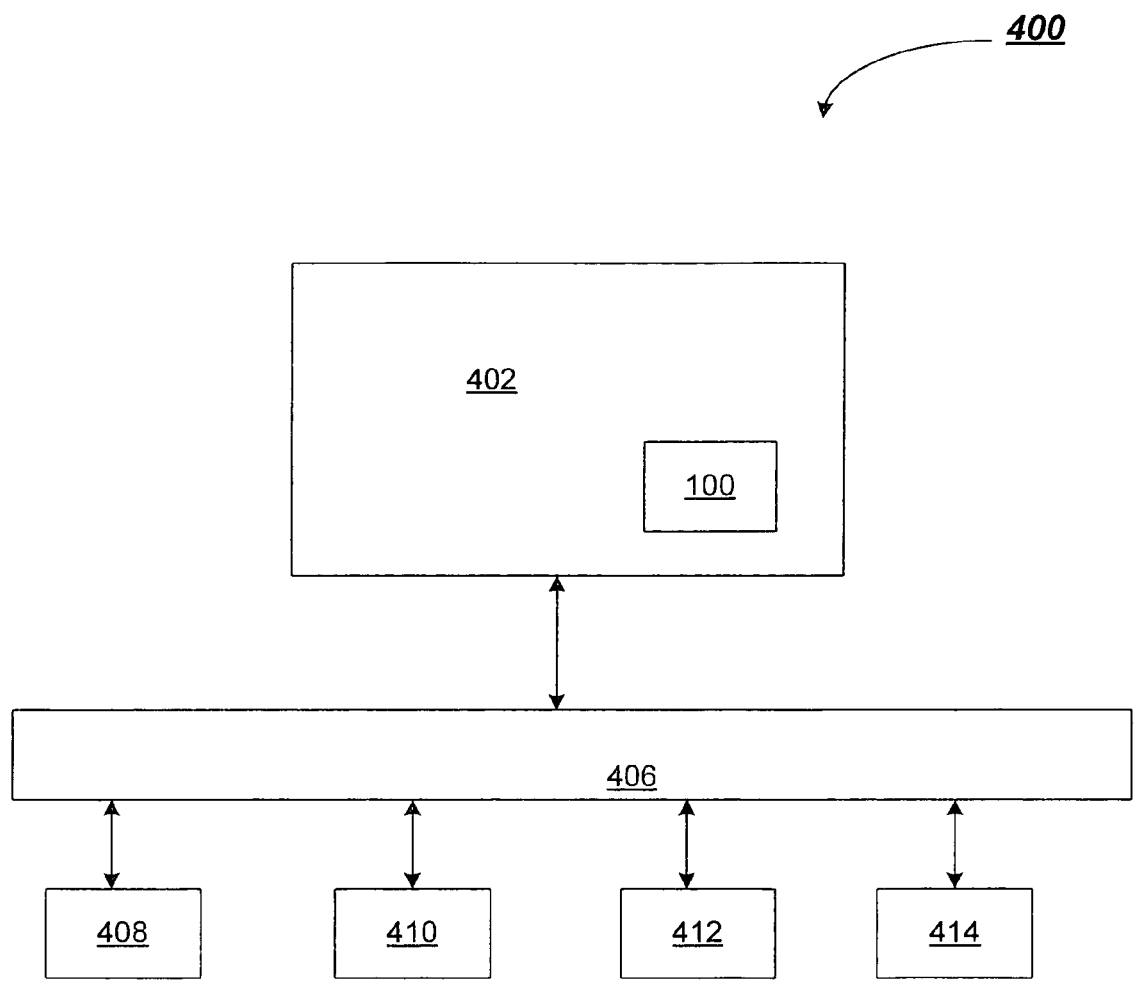

SINTERED METALLIC THERMAL INTERFACE MATERIALS FOR MICROELECTRONIC COOLING ASSEMBLIES

TECHNICAL FIELD

Embodiments of the present invention are generally directed to the field of integrated circuit packaging and, more particularly, to microelectronic cooling systems using thermal interface materials and associated methods.

BACKGROUND

In microelectronic cooling systems, Indium has traditionally been used as a solder thermal interface material to thermally attach microelectronic devices such as integrated circuits (IC) to heat spreading devices. Because of recent surges in Indium demand, the raw Indium price has skyrocketed in recent years (e.g., as of April 2006, Indium price ~$1,000/kg) severely increasing the cost of Indium used in IC packaging.

Although Indium's low melting temperature (156° C.) and thermal conductivity (K=82 W/m·K) make it suitable for solder attachment in IC packaging, Indium's low melting point also creates reliability challenges when, for example, Indium-soldered joints are subjected to temperature cycling. Moreover, Indium typically forms intermetallic compounds with other metals near attached surfaces causing microcracks. Intermetallic compounds may serve as void nucleation sites during hydrostatic stress driven voiding, weakening the structural integrity of the soldered joint. Solutions that incorporate more cost-effective thermal interface materials and/or intermetallic compound-free joints while providing high thermal conductivity are needed in the IC packaging industry to reduce such microcracking and temperature cycle reliability problems.

BRIEF DESCRIPTION OF THE DRAWINGS

Embodiments of the present invention are illustrated by way of example, and not by way of limitation, in the figures of the accompanying drawings in which like reference numerals refer to similar elements and in which:

FIG. 4 is a diagram illustrating an example system in which embodiments of the present invention may be used.

DETAILED DESCRIPTION

Embodiments of a microelectronic cooling assembly using sintered metallic thermal interface material(s), associated methods, and systems are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring the specification.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
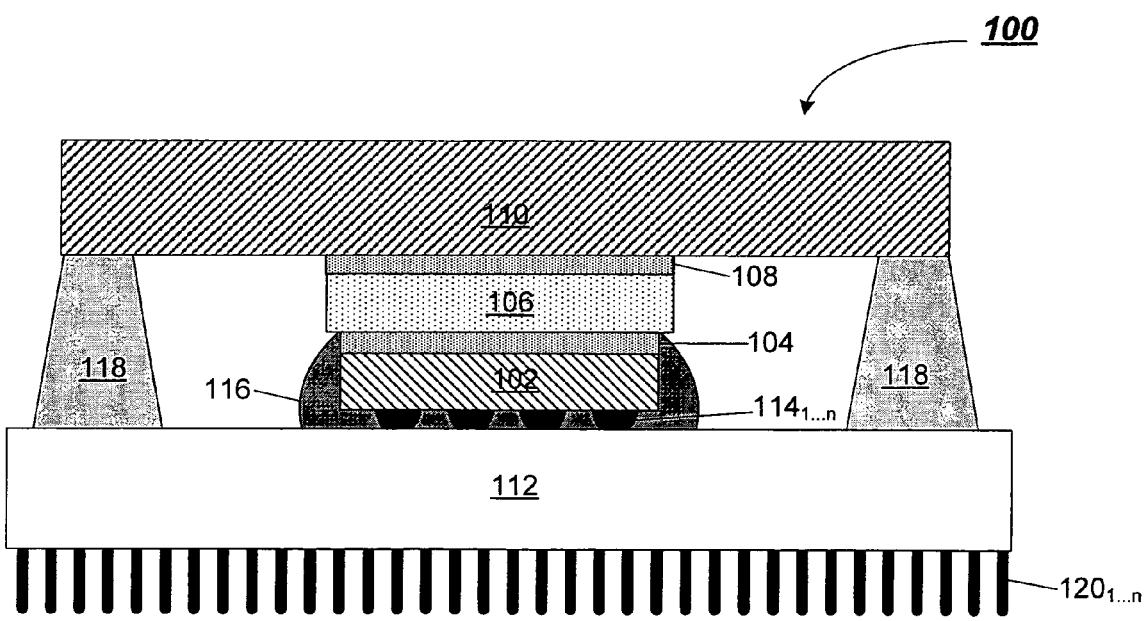
FIG. 1 is a cross-section diagram of a microelectronic cooling assembly, according to but one embodiment.

FIG. 1 is a cross-section diagram of a microelectronic cooling assembly 100, according to but one embodiment. Microelectronic cooling assembly 100 includes microelectronic device 102, device surface finish 104, thermal interface material (TIM) 106, spreader surface finish 108, heat spreader 110, substrate 112, interconnects $114_{1...n}$ (where n represents a variable number of repeating structures), underfill 116, sealant 118, and pins $120_{1...n}$, each coupled as shown, according to one embodiment.

In one embodiment, microelectronic cooling assembly 100 includes microelectronic device 102, TIM 106, and heat spreader 110, each thermally coupled as shown. In an embodiment, heat spreader 110 is an integral heat spreader (IHS) and microelectronic device 102 is an IC die. According to an embodiment, TIM 106 includes a sintered metallic nanopaste that forms a sintered metallic joint between the microelectronic device and the heat spreader. Sintering, in this sense, includes forming a bonded mass from metal particles by heating, but not melting. Sintered metallic nanopaste, in this example, thermally couples the microelectronic device 102 with a heat spreader 110 by forming a bonded metallic mass that thermally joins them.

Recently, nanopaste low-temperature sintering processes are emerging to produce bulk metal structures at significantly lower temperatures than melting temperatures of bulk metal counterparts. Low temperature sintering is key to an industry such as IC packaging where higher temperatures increase reliability concerns of electrical and structural components such as temperature-sensitive microelectronic devices 102 that may be subjected to the heating associated with sintering.

In an embodiment, nanopaste for forming TIM 106 includes nano-sized metallic particles, dispersants, reaction control agents, and solvents. A variety of dispersants, reaction control agents, and solvents can be used in embodiments of a nanopaste formulation and only some representative materials are provided in the following description. Nanopaste formulations are not necessarily limited to these examples.

Nano-sized metallic particles are combined with dispersants to keep the particles in fine distribution and reduce agglomeration. Dispersants typically promote distributive stability by reducing the surface tension energies of the nanoparticles. In one embodiment, dispersants include but are not limited to alkanolamide, alkanolamine, alkylaryl sulfonate, carboxylates of fatty acids, ethoxylates of fatty acids, sulfonates of fatty acids, sulfates of fatty acids, and combinations and mixtures thereof. In another embodiment, dispersant includes a material selected from the group consisting of alkanolamide, alkanolamine, alkylaryl sulfonate, carboxylates of fatty acids, ethoxylates of fatty acids, sulfonates of fatty acids, sulfates of fatty acids, and combinations and mixtures thereof.

Reaction control agents are typically stable and non-reactive with other nanopaste components at lower temperatures such as room temperature; but at elevated temperatures, they are activated to react with dispersants and remove them from nano-sized particles. As a result of this reaction, the nano-sized particles agglomerate through inter-diffusion with each other to reduce their surface tension energies and form bulk metal structures. In one embodiment, reaction control agents suitable for a nanopaste in TIM 106 application include primary amines, secondary amines, and tertiary amines. In another embodiment reaction control agents include a material selected from the group consisting of primary, secondary, and tertiary amines.

Solvents are primarily used to control the viscosity of the nanopaste according to the selected dispensing method such as stencil printing or ink jet printing, for example. In one embodiment, solvents for a nanopaste used to form TIM 106 include hydrocarbons such as hexane, octane, toluene, tradecane, etc. In another embodiment, solvents include polar solvents (alcohols, ethers, etc.), acryl monomers, epoxy monomers, and water. In yet another embodiment, a solvent includes a material selected from the group consisting of hydrocarbons, polar solvents, acryl monomers, epoxy monomers, and water.

A nanopaste suitable for use in forming a TIM 106 includes nano-sized metallic particles, according to one embodiment. Nano-sized means that the dimensions such as width, length, or diameter of a particle described in this manner are more comfortably described in terms of nanometers (nm) as opposed to larger metrics such as microns, for example. In this regard, according to one example embodiment, nanopaste suitable for forming TIM 106 includes nano-sized metallic particles ranging in size between about 5 and 50 nm.

Materials for a nanopaste suitable for TIM 106 include a variety of metals. Although any metal can be sintered, in general, materials for use in a nanopaste for TIM 106 applications are selected for favorable thermal conductivity, cost, melting temperature (sintering occurs below melting temperature), and reactivity with oxygen and other elements during the sintering process. Higher thermal conductivity of a TIM 106 material improves heat transfer from a microelectronic device 102 to a thermally joined heat spreader 110 through TIM 106. Higher melting temperature of a TIM 106 material increases temperature cycling reliability of the sintered TIM 106 material. Lower cost improves manufacturability by cost savings of raw materials. Lower reactivity with oxygen and other elements reduces the need for reducing or inert gas environments during sintering.

In one embodiment, materials suitable for a nanopaste include Ag, Cu, Au, Al, Mg, W, and Ni, but are not necessarily limited to these materials. In another embodiment, nanopaste for TIM 106 includes nano-sized metallic particles of a material selected from the group consisting of Ag, Cu, Au, al, Mg, W, and Ni. In another embodiment, nano-sized metallic particles of Ag or Cu are selected for a nanopaste used to form TIM 106 based on weighing a combination of factors discussed above. In other embodiments, other metallic materials are selected for use in a nanopaste according to favorable properties such as higher thermal conductivity, lower cost, higher melting temperature, and lower reactivity. Although combinations of metallic materials may be sintered together to form TIM 106, materials should be selected that limit the creation of intermetallic compounds, which may act as void nucleation sites resulting in microcracks.

Process conditions for sintering a nanopaste for TIM 106 are selected based on several factors. In an embodiment, particle size is a factor in determining the sintering temperature. Smaller particles can be sintered at lower temperatures than larger particles of a particular material. For example, conventional sintering of micro-sized particles of a given material may occur at temperatures ranging between about 500-600° C. while sintering of nano-sized particles of the same material may occur at temperatures less than about 250° C.

In one embodiment, sintering a nanopaste for TIM 106 occurs at a temperature less than about 250° C. In another embodiment, nanopaste for TIM 106 includes nano-sized particles ranging in size between about 5-50 nm. Particle size may be adjusted according to different applications to control metal contents, sintering kinetics, and sintering quality. In an example, smaller nano-sized particles are used to obtain finer sintered microstructures.

One challenge in creating TIM 106 from sintered nanopaste concerns porosity of the resulting bulk metal structure. Porosity decreases heat transfer effectiveness. Porosity can be reduced by modulating factors that affect porosity include nanopaste content, density, size distribution of nano-particles, and process conditions.

Pressured environmental conditions for sintering may achieve faster diffusion of sintering environmental gas into applied nanopastes, resulting in reduction of sintering time. In one embodiment, sintering occurs at pressures between about 1 and 50 atm. An example sintering process includes temperatures ranging between about 150-250° C., pressures ranging between about 1 and 50 atm., for a time period between about 5 minutes to 2 hours, according to one embodiment.

Organic materials in nanopaste formulations are typically removed during the sintering process. In one example embodiment, an air-induced process involving at least oxygen gas removes organics from nanopaste by vaporization. Applying air to nanopaste that includes less-reactive metallic materials such as Ag or Au allows $O_2$ to diffuse into the nanopaste and react with organics to be vaporized, aiding the emergence of bulk metal structures during sintering. In one example, an air-induced sintering process for Ag particles of about 5 nm in size occurs at about 200° C. for about 1 hour.

Reducing environmental conditions have been developed to reduce oxide formation on more reactive metallic particles such as Cu during sintering, according to one embodiment. Oxide layers, such as Cu—O for example, surround the metallic particles and inhibit the growth of bulk metal structures. In one embodiment, an argon-hydrogen gas mixture (e.g., 1-5% $H_2$) provides a reducing environmental condition for sintering. In another embodiment, a nitrogen-methanoic acid vapor mixture provides a reducing environmental condition for sintering. In other embodiments, hydrogen plasma, hydrogen radicals, nitrogen-formic acid vapor mixture, nitrogen-acetic acid vapor mixture, and nitrogen-acrylic acid vapor mixture gases are used in reducing environmental conditions. Higher pressure may achieve faster diffusion of sintering environmental gas into the nanopaste resulting in a reduction of sintering time.

In another embodiment, an inert gas environment is used for sintering a nanopaste to form TIM 106. According to one example embodiment, argon gas, nitrogen gas, or a combination thereof is used as an inert gas environment to reduce oxide formation.

In an embodiment, microelectronic device 102 and heat spreader 110 each comprise a surface finish 104 and 108, respectively, to enhance thermal coupling with TIM 106. In one embodiment, surface finish materials 104 and 108 include a metallic material that is identical to a metallic material used in a nanopaste used to form TIM 106. In another embodiment, surface finishes 104 and 108 include a metallic material of the same element as the metallic TIM material 106. In one embodiment, TIM 106 is substantially free of intermetallic compounds. Using the same metallic material for a surface finish as the TIM 106 reduces intermetallic compounds that may form when different metallic materials are thermally joined. Intermetallic compounds may operate as void nucleation sites leading to microcrack failures of the resultant joints. For example, an Indium-based TIM that encounters Au near a surface finish comprising Ni during soldering may form undesirable intermetallic compounds such as $Ni_2In_3$, $(NiAu)_2In_3$, and $AuIn_2$.

In one embodiment, surface finishes 104 and 108 are thermally coupled with TIM 106. In another embodiment, surface finishes 104 and 108 are selected from materials including Ag, Cu, Au, Al, Mg, W, and Ni. In another embodiment, surface finishes 104 and 108 include a material selected from the group consisting Ag, Cu, Au, Al, Mg, W, and Ni. In yet another embodiment, surface finishes 104 and 108 are the same metallic material as TIM 106.

Although the illustrated example of microelectronic cooling assembly 100 depicts surface finish 108 as a localized surface finish that does not span the entire length of heat spreader 110, surface finish 108 is not limited in this regard. In other embodiments, surface finish 108 is applied to various lengths of heat spreader 110 sufficient to provide thermal coupling with TIM 106. Analogous modifications to surface finish 104 and device 102 are envisioned and disclosed.

In other embodiments, microelectronic device 102 and/or heat spreader 110 include material(s) that are identical to the metallic material used in TIM 106. In such embodiments, surface finishes 104 and/or 108 may not be used at all. For example, TIM 106 and heat spreader 110 may include a common material such as Cu. In such embodiment, surface finish 108 may be excluded from assembly 100 altogether. In other embodiments, surface finishes 104 and 108 are excluded from assembly 100 altogether without regard to TIM 106, device 102, or spreader 110 material types. For example, the extent of microcracks from a given material combination or intermetallic compounds may not be sufficient to warrant a surface finish 104, 108 at all. Techniques for applying surface finishes 104 and 108 include particle vapor deposition (PVD), chemical vapor deposition (CVD), or any other suitable known method for depositing thin films or metallization.

Turning to other embodiments of assembly 100, microelectronic device 102 is an integrated circuit (IC) die, according to an embodiment. IC die may be fabricated from a semiconductor material such as silicon, for example. In another embodiment, microelectronic device 102 is a microprocessor. According to an embodiment, another device is electrically coupled to the microelectronic device 102. In one embodiment, the other device is an IC die. In another embodiment, the other device is a memory device.

Device 102 may be electrically coupled to other components, devices, or systems. In an embodiment, interconnect bumps $114_{1\ldots n}$ provide an electrical pathway for device 102 to electrically couple with other components, devices, or systems such as substrate 112. Interconnect bumps $114_{1\ldots n}$ may be associated with a flip-chip packaging arrangement. Substrate 112 may have pins $120_{1\ldots n}$ as part of a pin-grid array (PGA) package design to provide an electrical pathway for device 102 to electrically couple with other components, devices, or systems. In another embodiment, substrate 112 includes an array of solder balls as part of a ball-grid array (BGA) package design instead of pins $120_{1\ldots n}$ for electrical coupling with other elements.

Figure 2:
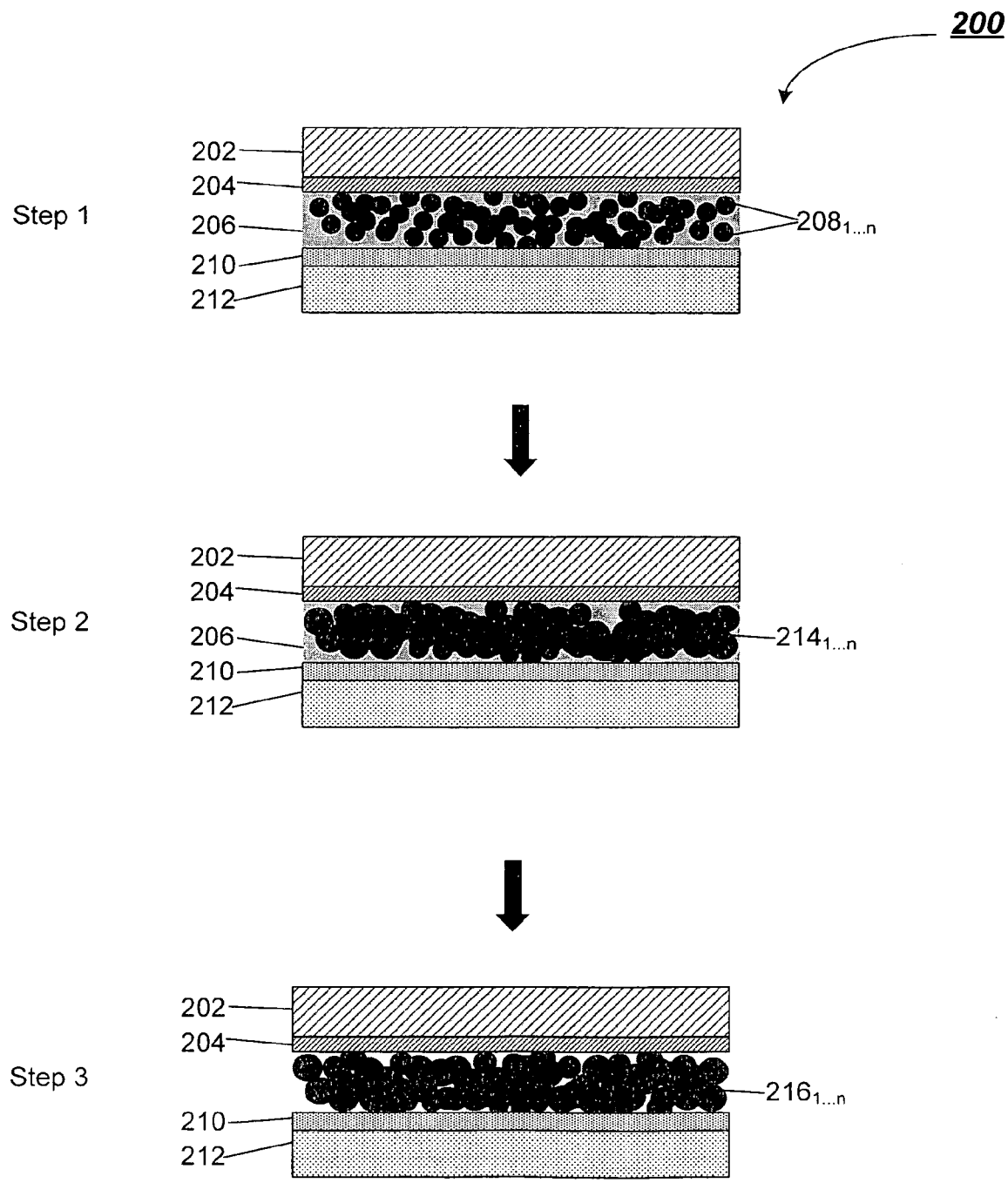
FIG. 2 is an illustrated flow diagram of an example method for fabricating a microelectronic cooling assembly, according to but one embodiment.

FIG. 2 is an illustrated flow diagram of an example method 200 for fabricating a microelectronic cooling assembly, according to but one embodiment. In step 1, a microelectronic cooling assembly is fabricated by providing a microelectronic device 212 and a heat spreader 202, according to one embodiment. In an embodiment, nanopaste 206 (including nano-sized metallic particles $208_{1\ldots n}$) is deposited between the microelectronic device 212 and heat spreader 202 as shown. Nanopaste 206 includes dispersants, reaction control agents, solvents, and nano-sized metallic particles $208_{1\ldots n}$, according to one embodiment. Nano-sized metallic particles $208_{1\ldots n}$ are combined with dispersants to keep the particles $208_{1\ldots n}$ in fine 20 distribution and reduce agglomeration. Dispersants typically promote distributive stability by reducing the surface tension energies of the nano-particles $208_{1\ldots n}$.

Solvents are primarily used to control the viscosity of the nanopaste 206, $208_{1\ldots n}$ according to the selected dispensing method such as stencil printing or ink jet printing, for example. Depositing a metallic nanopaste 206, $208_{1\ldots n}$ can be accomplished by a variety of methods. In one embodiment, nanopaste deposition 206, $208_{1\ldots n}$ is accomplished by a stencil-printing method. In another embodiment, nanopaste deposition 206, $208_{1\ldots n}$ is accomplished by an ink-jetting method. Other embodiments include nanopaste 206, $208_{1\ldots n}$ deposition by any known suitable deposition method.

In another embodiment of method 200, providing a microelectronic device 212 includes applying a surface finish 210 to the microelectronic device 212. In an embodiment, the surface finish 210 includes a metallic material of the same element as the nano-sized metallic particles $208_{1\ldots n}$ or resulting metallic TIM $216_{1\ldots n}$. In another embodiment, providing a heat spreader 202 includes applying a surface finish 204 to the heat spreader 202. The surface finish 204 includes a metallic material of the same element as the nano-sized metallic particles $208_{1\ldots n}$ and resulting metallic TIM $216_{1\ldots n}$, according to an embodiment. The surface finishes can be applied by a variety of techniques including PVD, CVD, and other known suitable thin film deposition techniques.

In step 2, a sintering process is applied to the microelectronic cooling assembly to sinter the metallic nanopaste 206, $214_{1\ldots n}$. Sintering the metallic nanopaste 206, $214_{1\ldots n}$ thermally couples the microelectronic device 212 and the heat spreader 202 by forming a sintered metallic joint $214_{1\ldots n}$ between the microelectronic device 212 and the heat spreader 202. Reaction control agents are typically stable and non-reactive with other nanopaste 206, $214_{1\ldots n}$ components at lower temperatures such as room temperature; but at elevated temperatures such as during sintering, they are activated to react with dispersants and remove them from nano-sized particles $214_{1\ldots n}$. As a result, sintering causes the nano-sized metallic particles $214_{1\ldots n}$ to agglomerate through interdiffusion with each other to reduce their surface tension energies and form bulk metal structures $214_{1\ldots n}$.

Organic materials in nanopaste 206 formulations are typically removed during the sintering process. In one example embodiment, an air-induced process involving at least oxygen gas removes nanopaste 206 organics by vaporization. Applying air to nanopaste 206 during sintering allows $O_2$ to diffuse into the nanopaste 206 and react with organics to be vaporized, aiding the emergence of bulk metal structures $214_{1\ldots n}$.

In step 3, the resultant bulk metal structure $216_{1\ldots n}$ forms a TIM $216_{1\ldots n}$ that thermally bonds microelectronic device 212 with heat spreader 202. In one example embodiment, TIM $216_{1\ldots n}$ and surface finishes 204 and 210 are part of a substantially all copper thermal bond between heat spreader 202 and microelectronic device 212. In another example embodiment, TIM $216_{1\ldots n}$ and surface finishes 204 and 210 are part of a substantially all silver thermal bond between heat spreader 202 and microelectronic device 212. According to an embodiment, TIM $216_{1...n}$ and surface finishes 204 and 210 are substantially free of intermetallic compounds.

In other embodiments of method 200, microelectronic device 212, surface finishes 210 and 204, nanopaste 206 including nano-sized metallic particles $208_{1...n}$, agglomeration and bulk growth of bonded nanoparticles during the sintering process $214_{1...n}$, and resultant metallic TIM $216_{1...n}$, accord with various embodiments already described for microelectronic cooling assembly 100.

Figure 3:
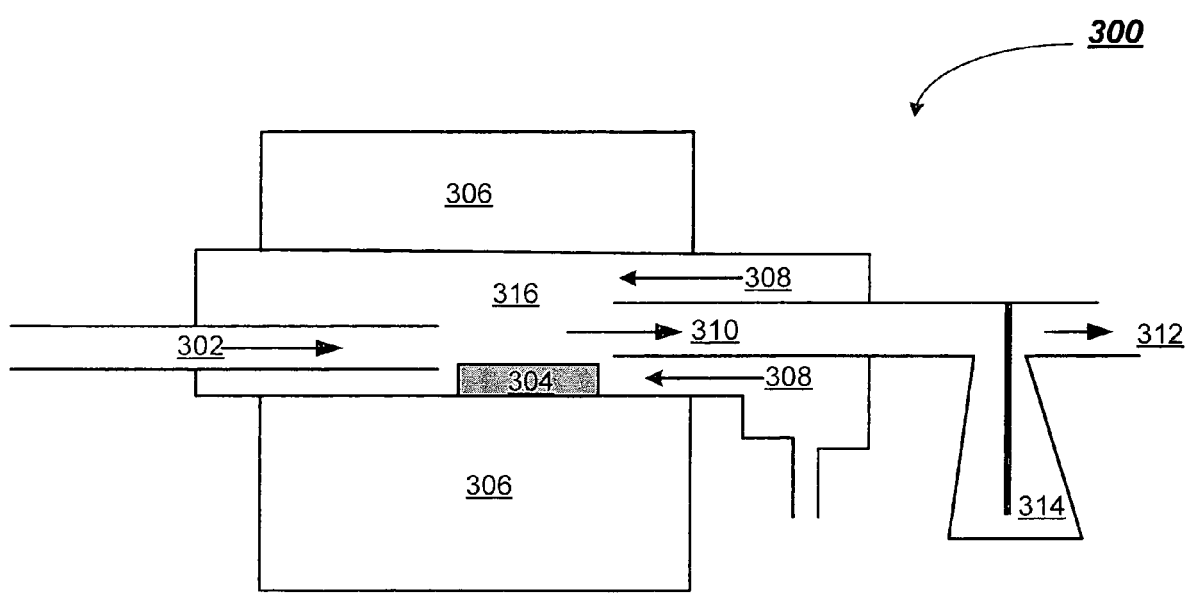
FIG. 3 is a diagram illustrating one of multiple methods for fabricating a nanopaste used in a microelectronic cooling assembly, according to but one embodiment.

FIG. 3 is a diagram illustrating one of multiple methods for fabricating a nanopaste used in a microelectronic cooling assembly, according to but one embodiment. Nanopaste formulations can be made by chemical synthesis or physical synthesis processes. FIG. 3 depicts a physical synthesis process 300. Nanopaste formulations in accordance with embodiments in this description are not limited to either process and can be made by chemical or physical synthesis.

According to a physical synthesis embodiment, target metal vapor is produced in an externally heated tube flow condenser 316 containing a crucible 304. Here, for example, the tube flow condenser 316 is heated by a furnace 306. An inert carrier gas 302 is preheated up to crucible 304 temperature and flows into the reaction tube. As the metal vapor exits the last furnace section 310 drawn by vacuum 312, it is quenched by an inert cooling gas 308 that induces cooling and metal powder is collected on a bag filter 314 containing dispersion agents. Metallic nanopastes are produced by adding reaction control agents and solvents to the dispersed nano-sized metallic particles. In one embodiment, a nanopaste for TIM application is made from an analogous physical process.

According to a chemical synthesis embodiment, typical thermal decomposition of metal complexes such as organic metal compounds can be used to produce nanopaste suitable for TIM applications. Suitable metal complexes are prepared by the stoichiometric reaction of the appropriate metal salt and the corresponding alkylamine or fatty acid in solvent. Most metal complexes have symmetric alkyl chains. By heating, the metal complex separates into the metal, which coalesces, and alkyl chains, which make a particular layer of dispersant that limits the overgrowth of metal particles by agglomeration, keeping the resultant metal particles well dispersed. Metallic nanopastes are produced by adding reaction control agents and solvents to the dispersed nano-sized metallic particles. In one embodiment, a nanopaste for TIM application is made from an analogous chemical process.

FIG. 4 is a depiction of but one system 400 of many possible systems in which embodiments of the present invention may be used. In one embodiment, an electronic assembly 402 includes a microelectronic cooling assembly 100 and its various embodiments as described herein. Assembly 402 may further include another microelectronic device, such as another microprocessor. In an alternate embodiment, the electronic assembly 402 may include an application specific IC (ASIC). Integrated circuits found in chipsets (e.g., graphics, sound, and control chipsets) may also be packaged in accordance with embodiments of this invention.

For the embodiment depicted by FIG. 4, the system 400 may also include a main memory 408, a graphics processor 410, a mass storage device 412, and/or an input/output module 414 coupled to each other by way of a bus 406, as shown. Examples of the memory 408 include but are not limited to static random access memory (SRAM) and dynamic random access memory (DRAM). Examples of the mass storage device 412 include but are not limited to a hard disk drive, a compact disk drive (CD), a digital versatile disk drive (DVD), and so forth. Examples of the input/output module 414 include but are not limited to a keyboard, cursor control arrangements, a display, a network interface, and so forth. Examples of the bus 406 include but are not limited to a peripheral control interface (PCI) bus, and Industry Standard Architecture (ISA) bus, and so forth. In various embodiments, the system 400 may be a wireless mobile phone, a personal digital assistant, a pocket PC, a tablet PC, a notebook PC, a desktop computer, a set-top box, a media-center PC, a DVD player, or a server.

Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A microelectronic cooling assembly comprising:
   a microelectronic device;
   a heat spreader; and
   a thermal interface material (TIM) thermally coupled with the microelectronic device and thermally coupled with the heat spreader, the TIM comprising a sintered metallic nanopaste that forms a sintered metallic joint between the microelectronic device and the heat spreader, wherein the nanopaste comprises nano-sized metallic particles combined with dispersant, reaction control agent, and solvent.

2. An assembly according to claim 1, wherein the nanopaste comprises nano-sized metallic particles of a material selected from the group consisting of Ag, Cu, Au, Al, Mg, W, and Ni.

3. An assembly according to claim 1, wherein the sintered metallic joint is formed by sintering the nanopaste at a temperature less than about 250° C., the nanopaste comprising nano-sized metallic particles ranging in size between about 5 and 50 nm.

4. An assembly according to claim 1, wherein the dispersant comprises a material selected from the group consisting of alkanolamide, alkanolamine, alkylaryl sulfonate, carboxylates of fatty acids, ethoxylates of fatty acids, sulfonates of fatty acids, sulfates of fatty acids, and mixtures thereof.

5. An assembly according to claim 1, wherein the reaction control agent comprises a material selected from the group consisting of primary, secondary, and tertiary amines.

6. An assembly according to claim 1, wherein the solvent comprises a material selected from the group consisting of hydrocarbons, polar solvents, acryl monomers, epoxy monomers, and water.

7. An assembly according to claim 1, wherein the TIM is substantially free of intermetallic compounds.

8. An assembly according to claim 1, wherein the nanopaste is made from a physical process.

9. An assembly according to claim 1, wherein the nanopaste is made from a chemical process.

10. An assembly according to claim 1, wherein the microelectronic device and the heat spreader each comprise a surface finish that is thermally coupled with the TIM, the surface finishes comprising a metallic material of the same element as the metallic TIM material.

11. A method for fabricating a microelectronic cooling assembly comprising:
providing a microelectronic device and a heat spreader;
depositing a metallic nanopaste between the microelectronic device and the heat spreader; and
sintering the metallic nanopaste to form a thermal interface material that thermally couples the microelectronic device and the heat spreader by forming a sintered metallic joint between the microelectronic device and the heat spreader, wherein the nanopaste comprises nano-sized metallic particles combined with dispersant, reaction control agent and solvent.

12. A method according to claim 11, wherein the nanopaste comprises nano-sized metallic particles of a material selected from the group consisting of Ag, Cu, Au, Al, Mg, W, and Ni.

13. A method according to claim 11, wherein sintering the metallic nanopaste occurs at a temperature less than about 250° C., the nanopaste comprising nano-sized metallic particles ranging in size between about 5 and 50 nm.

14. A method according to claim 11, wherein the dispersant comprises a material selected from the group consisting of alkanolamide, alkanolamine, alkylaryl sulfonate, carboxylates of fatty acids, ethoxylates of fatty acids, sulfonates of fatty acids, sulfates of fatty acids, and mixtures thereof.

15. A method according to claim 11, wherein the reaction control agent comprises a material selected from the group consisting of primary, secondary, and tertiary amines.

16. A method according to claim 11, wherein the solvent comprises a material selected from the group consisting of hydrocarbons, polar solvents, acryl monomers, epoxy monomers, and water.

17. A method according to claim 11, wherein the TIM is substantially free of intermetallic compounds.

18. A method according to claim 11, wherein the nanopaste is made from a physical process.

19. A method according to claim 11, wherein the nanopaste is made from a chemical process.

20. A method according to claim 11, wherein providing a microelectronic device and a heat spreader further comprises:
applying a surface finish to the microelectronic device, the surface finish comprising a metallic material of the same element as the metallic TIM;
applying a surface finish to the heat spreader, the surface finish comprising a metallic material of the same element as the metallic TIM.

21. A method according to claim 11, wherein depositing a metallic nanopaste between the microelectronic device and the heat spreader is accomplished by stencil printing.

22. A method according to claim 11, wherein depositing a metallic nanopaste between the microelectronic device and the heat spreader is accomplished by ink jet printing.

23. A method according to claim 11, wherein sintering the metallic nanopaste is accomplished in an inert gas environment at a pressure between about 1 and 50 atm.

24. A microelectronic cooling system comprising:
a microelectronic device;
a heat spreader,
a thermal interface material (TIM) thermally coupled with the microelectronic device and thermally coupled with the heat spreader, the TIM comprising a sintered metallic nanopaste that forms a sintered metallic joint between the microelectronic device and the heat spreader, and
an other device electrically coupled to the microelectronic device, wherein the nanopaste comprises nano-sized metallic particles combined with dispersant, reaction control agent, and solvent.

25. A system according to claim 24 wherein the microelectronic device is an integrated circuit die and the other device is a memory device.

26. A system according to claim 24, wherein the sintered metallic joint is formed by sintering the nanopaste at a temperature less than about 250° C., the nanopaste comprising nano-sized metallic particles ranging in size between about 5 and 50 nm.

27. A system according to claim 24, wherein the TIM is substantially free of intermetallic compounds.

* * * * *